United States Patent
La Fetra et al.

(10) Patent No.: US 9,354,970 B2
(45) Date of Patent: May 31, 2016

(54) METHOD AND APPARATUS FOR ENCODING ERRONEOUS DATA IN AN ERROR CORRECTION CODE PROTECTED MEMORY

(71) Applicant: Advanced Micro Devices, Inc., Sunnyvale, CA (US)

(72) Inventors: Ross V. La Fetra, Sunnyvale, CA (US); Vilas K. Sridharan, Brookline, MA (US); Vydhyanathan Kalyanasundharam, San Jose, CA (US); Dean A. Liberty, Nashua, NH (US); Amit P. Apte, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 95 days.

(21) Appl. No.: 14/230,115

(22) Filed: Mar. 31, 2014

(65) Prior Publication Data
US 2015/0278016 A1 Oct. 1, 2015

(51) Int. Cl.
*G06F 11/10* (2006.01)
*H04L 1/00* (2006.01)
*H04L 27/00* (2006.01)
*G11B 20/18* (2006.01)
*G11C 29/52* (2006.01)

(52) U.S. Cl.
CPC .......... *G06F 11/1076* (2013.01); *H04L 1/0045* (2013.01); *H04L 1/0057* (2013.01); *G11B 20/1833* (2013.01); *G11C 29/52* (2013.01); *H04L 1/0071* (2013.01); *H04L 2027/0036* (2013.01)

(58) Field of Classification Search
CPC ... H04L 1/0045; H04L 1/0057; H04L 1/0041; H04L 1/0071; H04L 2027/0036
USPC ................................................. 714/763, 766
See application file for complete search history.

(56) References Cited

U.S. PATENT DOCUMENTS

| | | | | |
|---|---|---|---|---|
| 5,793,795 A * | 8/1998 | Li | ........................ | H04B 1/713 375/33 |
| 5,832,026 A * | 11/1998 | Li | ........................ | H04B 1/713 340/12.11 |
| 6,859,488 B2 * | 2/2005 | Azenkot | ............... | H04L 1/0045 375/147 |
| 6,981,197 B2 * | 12/2005 | Liu | ........................ | H03M 13/27 714/765 |
| 7,509,560 B2 * | 3/2009 | Alexander | ............. | G11C 29/42 714/763 |
| 8,949,699 B1 * | 2/2015 | Gustlin | ............. | H03M 13/1515 714/784 |
| 2004/0216028 A1 * | 10/2004 | Fukuhara | ............... | H04N 19/63 714/776 |
| 2007/0198904 A1 * | 8/2007 | Yoshida | ............ | H03M 13/1565 714/785 |
| 2010/0296379 A1 * | 11/2010 | Ito | ........................ | G11B 5/743 369/53.41 |
| 2010/0303279 A1 * | 12/2010 | Tian | ........................ | G06T 1/005 382/100 |
| 2014/0237316 A1 * | 8/2014 | Tantos | ................... | H03M 5/145 714/758 |
| 2015/0039972 A1 * | 2/2015 | Lynch | ..................... | G10L 19/02 714/775 |

* cited by examiner

*Primary Examiner* — James C Kerveros
(74) *Attorney, Agent, or Firm* — Volpe and Koenig, P.C.

(57) ABSTRACT

A method and device are described for encoding erroneous data in an error correction code (ECC) protected memory. In one embodiment, incoming data including a plurality of data symbols and a data integrity marker is received. At least one extra symbol is used to mark the incoming data as error-free data or erroneous data (i.e., poison) based on the data integrity marker. ECC may be created to protect the data symbols. The ECC may include a plurality of check symbols, a plurality of unused symbols and the at least one extra symbol. In another embodiment, an error marker may be propagated from a single ECC word to all ECC words of data block (e.g., a cache line, a page, and the like) to prevent errors due to corruption of the error marker caused by faulty memory in the erroneous ECC word.

18 Claims, 5 Drawing Sheets

METHOD AND APPARATUS FOR ENCODING ERRONEOUS DATA IN AN ERROR CORRECTION CODE PROTECTED MEMORY

FIELD OF INVENTION

The present invention is generally directed to encoding erroneous (i.e., "poisoned") data in a memory subsystem.

BACKGROUND

Currently, erroneous data (i.e., data known to be bad, also referred to herein as "poisoned" data), may be stored using existing storage bits in error correction code (ECC)-protected memories, such as a dynamic random access memory (DRAM). In one scheme, extra storage bits may be used to save poisoned data indicators. However, extra storage may be required to implement this scheme, which may be expensive and non-standard. In another scheme, it may be possible to mark data blocks (e.g., cache lines, pages, and the like), as "poison" using existing ECC, via a special error (i.e., poison) indicator. However, if a memory location is already faulty, encoding the error indicator into the ECC at that location may alter the ECC state of the data block, whereby it may convert a corrected error into an uncorrected error or an undetected error, or it may convert an uncorrected error into an undetected error.

Furthermore, ECC typically may protect $2^n-1$ symbols, although data is typically grouped in $2^m$ symbols, where n>m. One example is when n=m+1. This may leave $2^n-2^m-1$ symbols unused by the data. Some of these symbols may be needed for check symbols, but there may be more symbols available for protection than are needed. Thus, the ECC code may be shortened by forcing the unused symbols to zero. For example, 128 data bits may be divided into sixteen 8-bit symbols, and may require 4 check symbols. An ECC code capable of protecting 31 symbols may be used, where 16 symbols are data, 4 symbols are check symbols, and the remaining 11 symbols are unused, thus creating a (20,16) code from the available (37,31) code. However, a static value of a check symbol may not be used as a poison indicator, as all possible values of the check symbol are used with valid data.

SUMMARY OF THE EMBODIMENTS

A method is described for encoding erroneous data in an error correction code (ECC) protected memory. In one embodiment, incoming data including a plurality of data symbols and a data integrity marker is received. At least one extra symbol is used to mark the incoming data as error-free data or erroneous data (i.e., poison) based on the data integrity marker. ECC may be created to protect the data symbols. The ECC may include a plurality of check symbols, a plurality of unused symbols and the at least one extra symbol.

In another embodiment, when it is determined that a partial write of a data block marked as erroneous data has been requested, the partial data block write may be converted to a full data block write. All ECC words in the data block may be marked as being erroneous. The data block with the marked ECC words may be written into memory. The partial data block write may be converted by preserving remaining data in the data block, or by replacing remaining data with known data. When it is determined that a partial write of a data block marked as erroneous data has not been requested, all ECC words in the data block may be marked as being erroneous. The data block with the marked ECC words may be written into memory.

In another embodiment, ECC including a plurality of check symbols may be read, the ECC may be decoded to recover at least one extra symbol, and a determination may be made as to whether the at least one extra symbol marks data in the ECC as error-free or erroneous. The data in the ECC may be forwarded to a requestor with an indication that the data is error-free or erroneous based on the determination.

In another embodiment, an ECC word in a data block including a plurality of ECC words may be read, and the read ECC word may be forwarded to a requestor on a condition that the ECC is determined not to have an error.

In another embodiment, a first ECC word in a data block including a plurality of ECC words may be read, and all remaining ECC words in the data block may be forwarded to a requestor with an indication that the data block has erroneous data, on a condition that the first ECC word has an error and either the first ECC word or any other ECC word in the remainder of the data block is marked as erroneous data.

In another embodiment, a device includes a processor configured to receive incoming data including a plurality of data symbols and a data integrity marker, and use at least one extra symbol to mark the incoming data as error-free data or erroneous data. The device further includes a memory configured to store the incoming data. The processor may be further configured to create ECC to protect the data symbols. The ECC may include a plurality of check symbols, a plurality of unused symbols and the at least one extra symbol.

The processor may be further configured to determine that a partial write of a data block marked as erroneous data has been requested, convert the partial data block write to a full data block write, mark all ECC words in the data block as being erroneous, and write the data block with the marked ECC words into the memory. The processor may be further configured to determine that a partial write of a data block marked as erroneous data has not been requested, mark all ECC words in the data block as being erroneous, and write the data block with the marked ECC words into the memory. The processor may be further configured to read ECC including a plurality of check symbols, decode the ECC to recover at least one extra symbol, and determine whether the at least one extra symbol marks data in the ECC as error-free or erroneous.

In another embodiment, a non-transitory computer-readable storage medium is configured to store a set of instructions used for testing a semiconductor device. The semiconductor device includes a processor configured to receive incoming data including a plurality of data symbols and a data integrity marker, and use at least one extra symbol to mark the incoming data as error-free data or erroneous data. The semiconductor device further includes a memory configured to store the incoming data. The instructions may be Verilog data instructions or hardware description language (HDL) instructions. The processor may be further configured to create ECC to protect the data symbols. The ECC may include a plurality of check symbols, a plurality of unused symbols and the at least one extra symbol. The processor may be further configured to determine that a partial write of a data block marked as erroneous data has been requested, convert the partial data block write to a full data block write, mark all ECC words in the data block as being erroneous, and write the data block with the marked ECC words into the memory.

BRIEF DESCRIPTION OF THE DRAWINGS

A more detailed understanding may be had from the following description, given by way of example in conjunction with the accompanying drawings wherein.

DETAILED DESCRIPTION OF THE EMBODIMENTS

Embodiments are described for propagating a poison marker from a single ECC word to all ECC words of a data block (e.g., cache line, a page, and the like). This prevents further errors due to corruption of the poison marker caused by faulty memory in the poisoned ECC words. Furthermore, embodiments are described for generating ECC with at least one extra symbol marked as error-free data or erroneous data.

Figure 1:
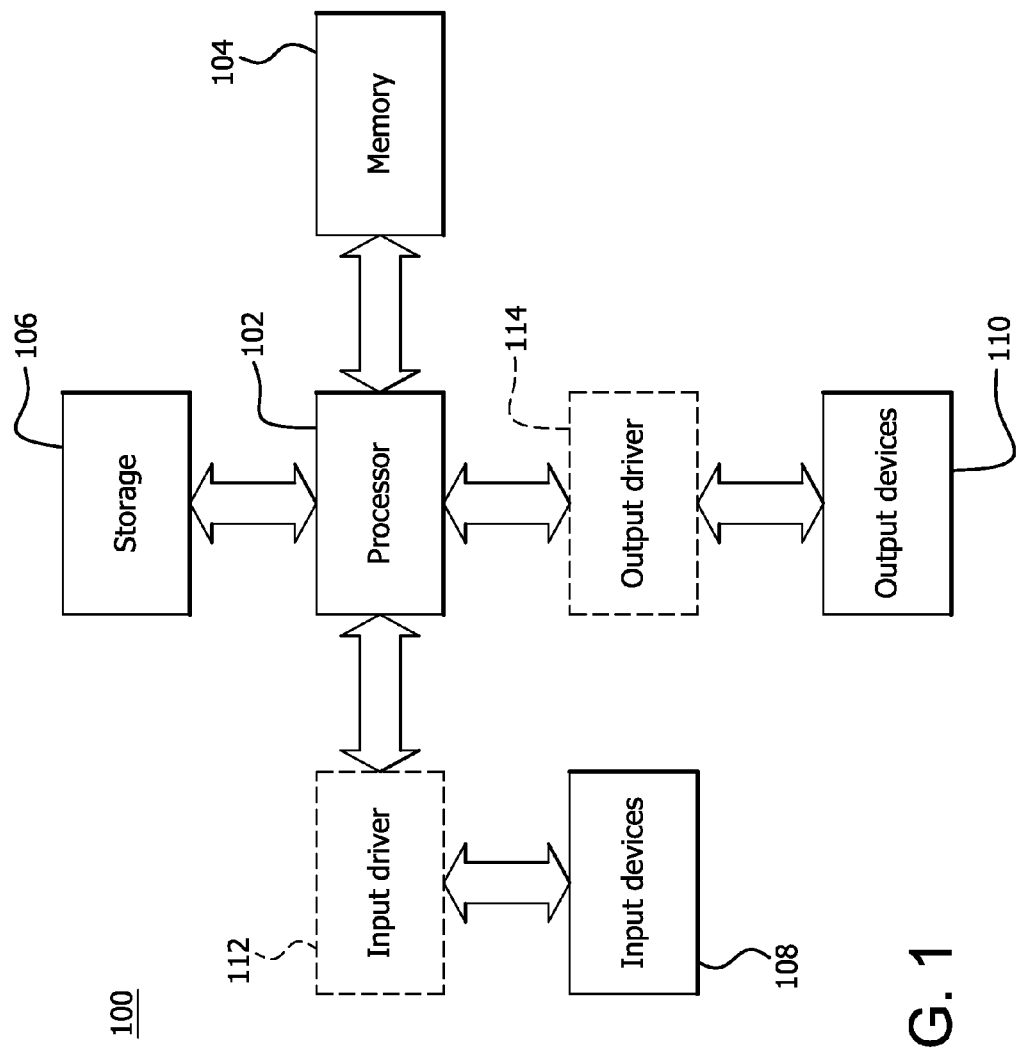
FIG. 1 is a block diagram of an example device in which one or more disclosed embodiments may be implemented.

FIG. 1 is a block diagram of an example device 100 in which one or more disclosed embodiments may be implemented. The device 100 may include, for example, a computer, a gaming device, a handheld device, a set-top box, a television, a mobile phone, or a tablet computer. The device 100 includes a processor 102, a memory 104, a storage 106, one or more input devices 108, and one or more output devices 110. The device 100 may also optionally include an input driver 112 and an output driver 114. It is understood that the device 100 may include additional components not shown in FIG. 1.

The processor 102 may include a central processing unit (CPU), a graphics processing unit (GPU), a CPU and GPU located on the same die, or one or more processor cores, wherein each processor core may be a CPU or a GPU. The memory 104 may be located on the same die as the processor 102, or may be located separately from the processor 102. The memory 104 may be a memory subsystem including at least a volatile or non-volatile memory, for example, random access memory (RAM), dynamic RAM, or a cache.

The storage 106 may include a fixed or removable storage, for example, a hard disk drive, a solid state drive, an optical disk, or a flash drive. The input devices 108 may include a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 may include a display, a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. It is noted that the input driver 112 and the output driver 114 are optional components, and that the device 100 will operate in the same manner if the input driver 112 and the output driver 114 are not present.

In one embodiment, a method may be implemented to dynamically alter the type of error detection and correction provided in a memory subsystem, such as the memory 104 shown in FIG. 1, by altering the manner in which ECC bits are encoded. Robust detection of faults may be provided when no known faults exist, as well as providing guaranteed detection of a second fault when a first fault is already present. ECC may be created with at least one extra symbol such as, for example, by shortening the code by a smaller amount than is typically used. An extra symbol is a symbol not needed for the primary purpose of storing data and error correction codes for data, (i.e., the extra symbol is not physically stored in the memory, it serves as a virtual symbol). The ECC may protect the at least one extra symbol without any significant cost. Thus, only an erroneous data marker needs to be stored, rather than the data itself, and therefore no additional storage is required for the at least one extra symbol.

For error-free data, check symbols may be generated with at least one extra symbol marked as error-free data (e.g., using a value of zero), and stored into memory. Marking of error-free data may be implemented by setting one or more values, bits and the like. When the data is read out from the memory, a syndrome may be generated with the at least one extra symbol marked as error-free data. For example, a syndrome may be the exclusive OR of the generated and stored check bits, which represent an error. Since there is no error in the at least one extra symbol, the code may correct and detect errors in the data and check bits.

For poisoned data, check symbols may be generated with at least one extra symbol marked as erroneous data (e.g., using a specific non-zero value), and stored into memory. Marking of erroneous data may be implemented by setting one or more values, bits and the like. When the data is read out from memory, a syndrome may be generated with the at least one extra symbol marked as erroneous data, as previously described. However, an error may exist in the extra symbol, since it was generated and checked with different values. In the absence of any other errors, the code may detect and identify the failing symbol, and recognize it as poisoned data. In the presence of other errors, as long as the total error and data with the at least one extra symbol is within the code's ability to correct, the poisoned data is identified. If the total error is within the code's ability to detect uncorrectable errors, the data will not be detected as being poisoned, but it will still be detected as being bad (i.e., erroneous). If the total error is beyond the code's ability to detect, the outcome is not guaranteed. If the error in memory is known, then the data value written with the poisoned data (which is arbitrary) may be chosen that falls within the code's ability to correct. A simple approach is to read the data, and write it back with the poisoned check symbols. Any static data error may be safely poisoned this way. Bad check bits may be handled as well, but it may be more difficult to choose a data value. One minor downfall to implementing this procedure is that one additional symbol in an error correction block must be decoded.

Figure 2A:
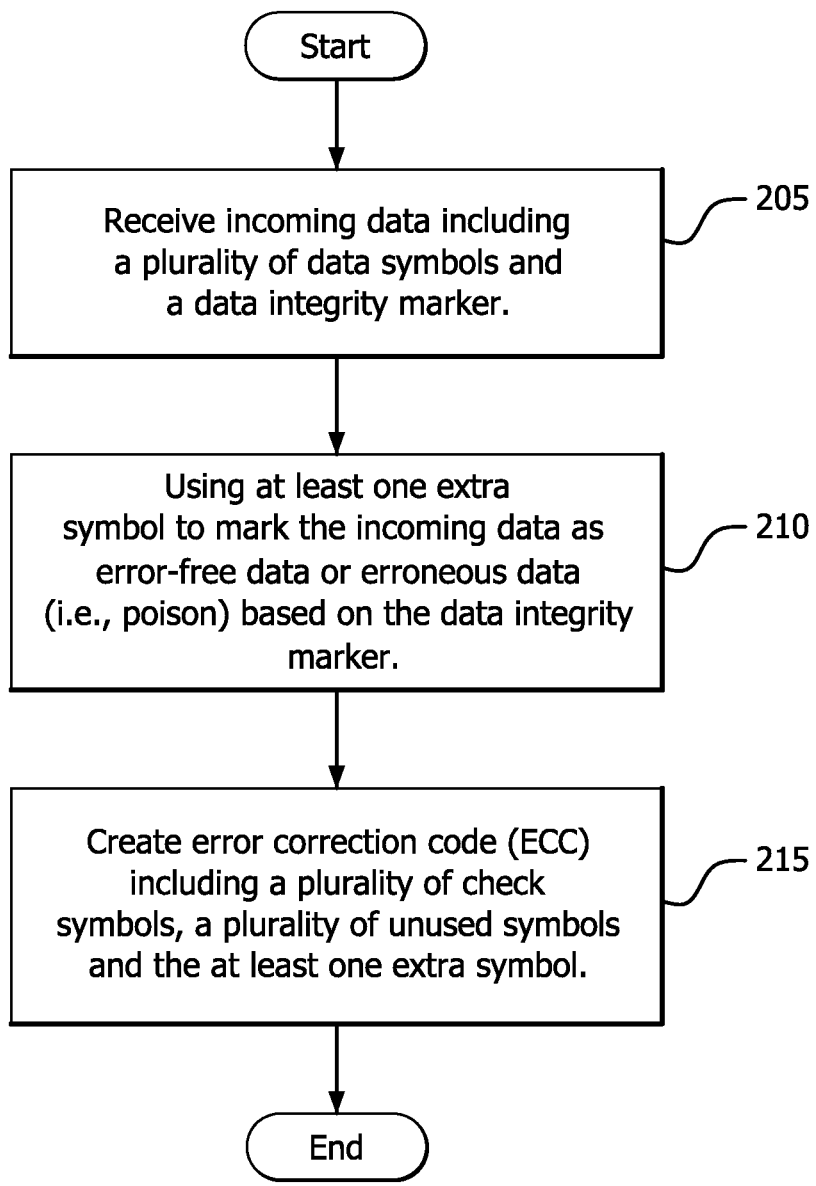
FIG. 2A is a flow diagram of a procedure for creating error correction code (ECC)

FIG. 2A is a flow diagram of a procedure 200 for creating error correction code (ECC) in accordance with the embodiment described above. Incoming data including a plurality of data symbols and a data integrity marker is received (205). At least one extra symbol is used to mark the incoming data as error-free data or erroneous data (i.e., poison) based on the data integrity marker (210). ECC is then created that includes a plurality of check symbols, a plurality of unused symbols and the at least one extra symbol (215).

In another embodiment, a poison marker may be propagated from a single ECC word to all ECC words of a data block, (e.g., a cache line, a page, and the like). This procedure may prevent errors due to corruption of the poison marker caused by faulty memory in the poisoned ECC word. Further, this procedure may reduce the risk of any data corruption from injecting a poison marker into the ECC, as well as allow the memory controller to determine the state of the line with high probability.

Figure 2B:
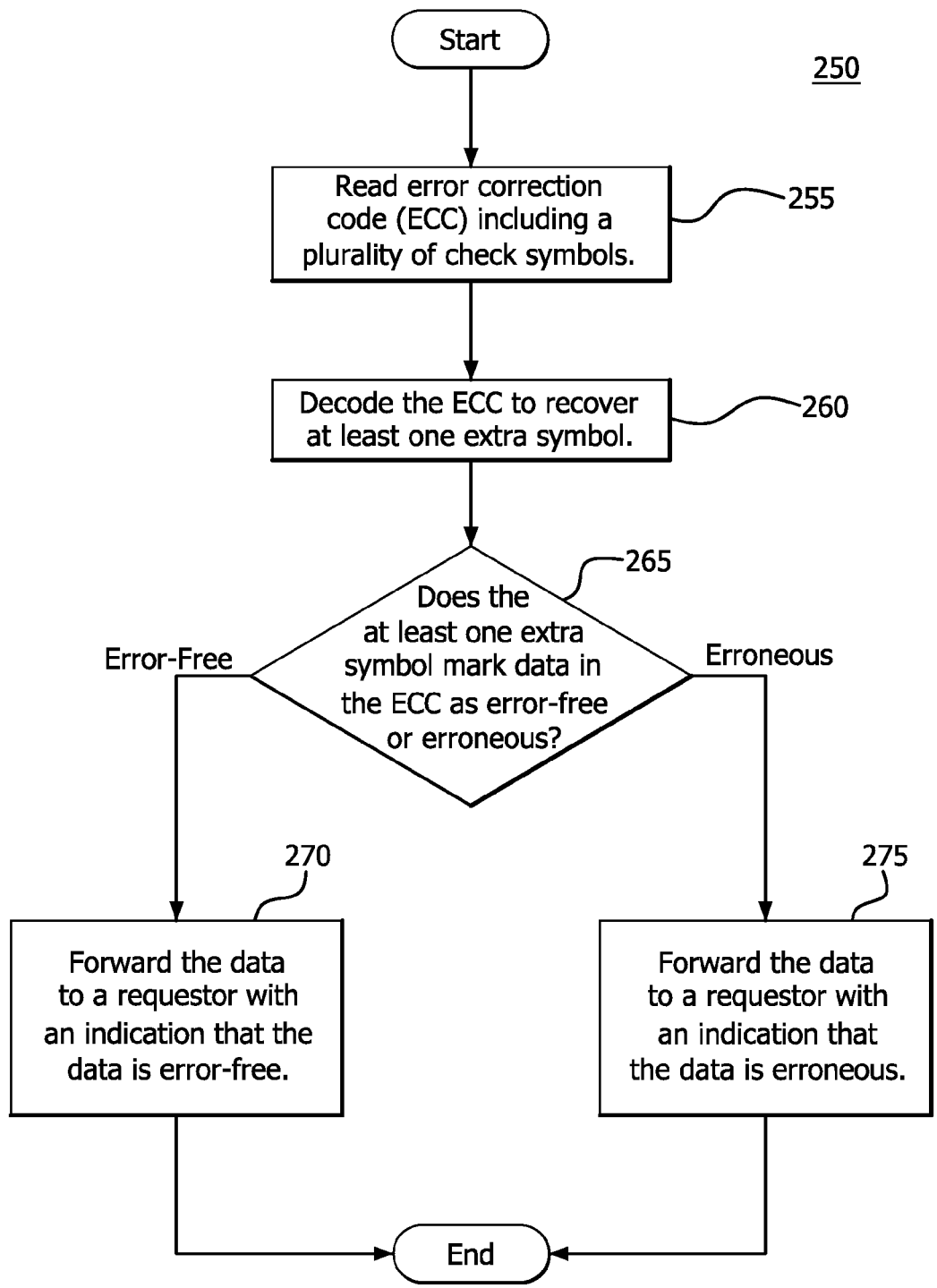
FIG. 2B is a flow diagram of a procedure for indicating to a requestor whether data is error-free or erroneous (i.e., poison)

FIG. 2B is a flow diagram of a procedure 250 for indicating to a requestor whether data is error-free or erroneous (i.e., poison). ECC including a plurality of check symbols is read (255). The ECC is decoded to recover at least one extra symbol (260). If it is determined that the at least one extra symbol marks data in the ECC as error-free (265), the data is forwarded to a requestor with an indication that the data is error-free (270). If it is determined that the at least one extra symbol marks data in the ECC as erroneous (265), the data is forwarded to a requestor with an indication that the data is erroneous (275).

In one embodiment using write path logic, all writes of poison data may be propagated to poison an entire data block in memory. A full-line write may write the incoming data marked with a poison marker, and a partial-line write may be converted to a full-line write. All ECC words in the data block may be marked as poison. The incoming data may be written to memory, and the data in the rest of the data block may either be preserved (via a read-modify-write of the data block in memory), or the memory controller may write a predetermined value (e.g., all zeros (0's)) to this portion of the data block.

Figure 3A:
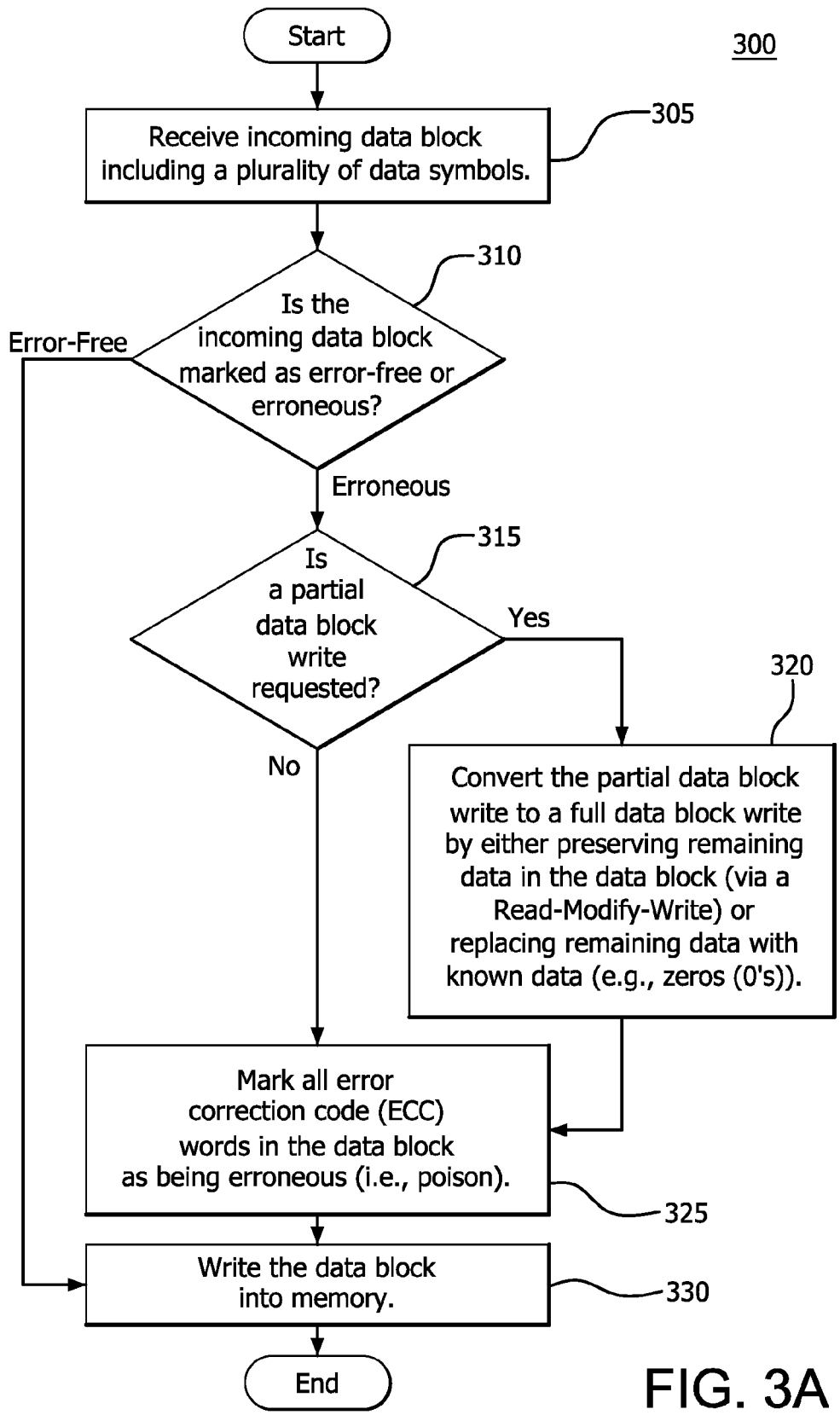
FIG. 3A is a flow diagram of a procedure for writing data marked as erroneous.

FIG. 3A is a flow diagram of a procedure 300 for writing data marked as erroneous. An incoming data block including a plurality of data symbols is received (305). If it is determined that the incoming data block is marked as erroneous (310), a determination is made as to whether or not a partial data block write is requested (315). If a partial data block write is requested, the partial data block write is converted to a full data block write by either preserving remaining data in the data block (via a read-modify-write) or replacing remaining data with known data (e.g., zeros (0's)), (320). If a partial data block write is not requested, or after a partial data block write is converted to a full data block write, all ECC words in the data block are then marked as being erroneous, (i.e., poison), (325), and the data block is written into memory. If it is determined that the incoming data block is marked as error-free (310), the data block is immediately written into memory (330).

In another embodiment using read path logic, all reads may behave such that if an ECC word has no error, the ECC word may be forwarded to the requestor. For example, this may indicate that a data block is not poisoned, and/or that there are either 0 or >2 bad symbols in that data block (for a code that can detect two bad symbols). Otherwise, if the ECC word has an error, and if the ECC word or any ECC word in the remainder of the data block has a poison marker, all remaining ECC words in the data block may be forwarded to the requestor with an indication that the data block has erroneous data, (this may occur since the correctness of any already-forwarded data is guaranteed up to the capability of the code to detect). If any ECC words have already been forwarded to the requestor since those words had no ECC errors, the entire data block may be marked as poison in a memory, (e.g., a DRAM). Otherwise, if the ECC word or any ECC word in the remainder of the data block has an uncorrectable error, the entire data block may be marked as poison in the memory, (e.g., a DRAM), and all remaining ECC words in the data block may be forwarded to the requestor with an indication that the data block has erroneous data, (since it is guaranteed that any already-forwarded data is correct). Otherwise, one or more ECC words may have a correctable error, and normal ECC processing and data forwarding may commence.

In yet another embodiment, DRAM periodic scrubber logic may be modified such that if an ECC word in a data block with an uncorrectable error is detected, the entire data block may be marked as poison in the DRAM array. The scrubber detects and repairs ECC errors.

Figure 3B:
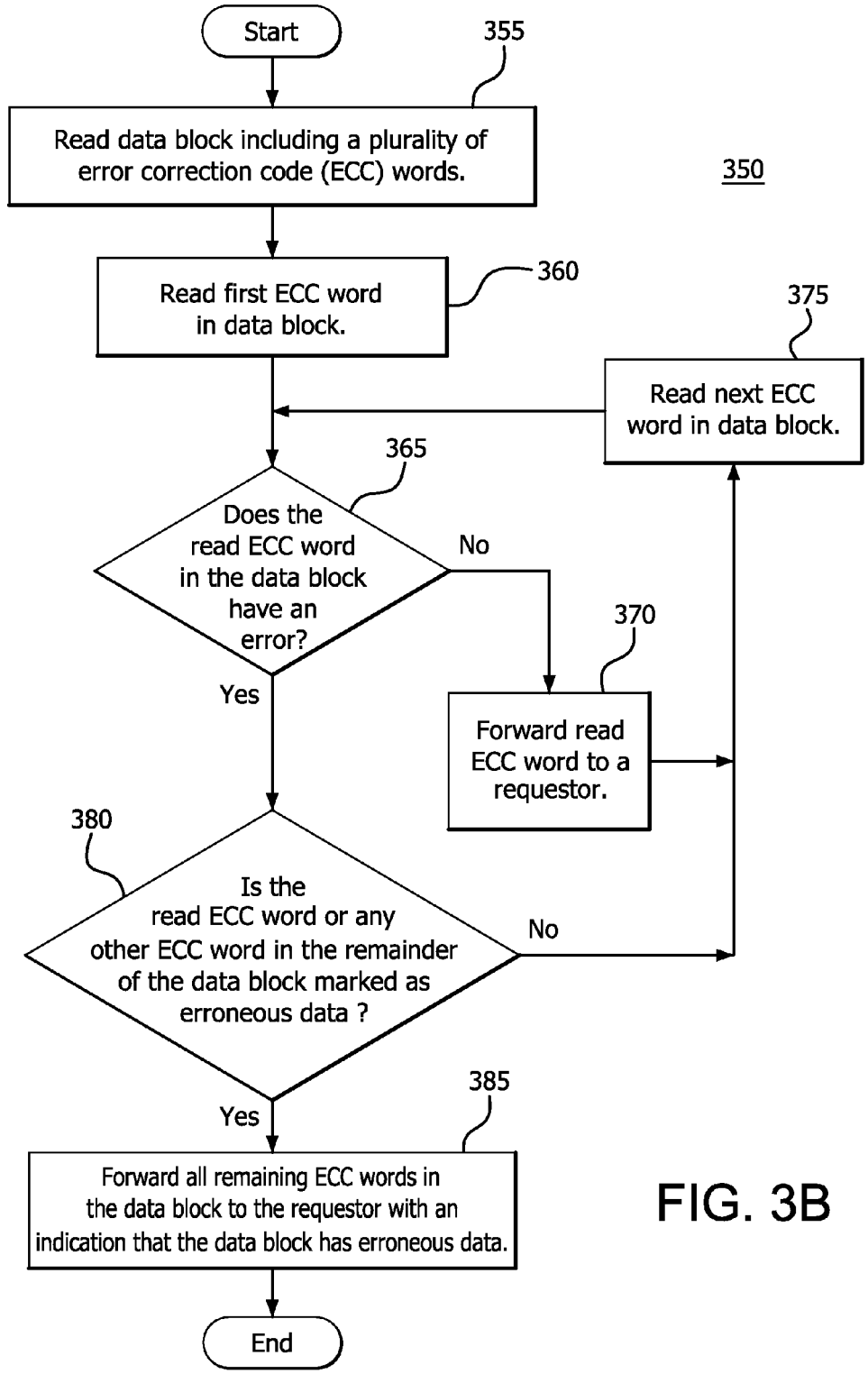
FIG. 3B is a flow diagram of a procedure for marking erroneous ECC words in a data block.

FIG. 3B is a flow diagram of a procedure 350 for marking erroneous ECC words in a data block. A data block is read that includes a plurality of ECC words (355). A first one of the ECC words in the data block is read (360) and a determination is made as to whether the read ECC word in the data block has an error (365). If it is determined that the read ECC word in the data block does not have an error, the read ECC word is forwarded to a requestor (370) and a next ECC word in the data block is read (375). If it is determined that the read ECC word in the data block has an error (365), a determination is made as to whether the ECC word or any other ECC word in the remainder of the data block marked as erroneous data (i.e., poison), (380). If it is determined that an ECC word in the remainder of the data block is marked as erroneous data, all remaining ECC words in the data block are forwarded to the requestor with an indication that the data block has erroneous data (385).

Referring again to FIG. 1, a device 100 includes a processor 102 configured to receive incoming data including a plurality of data symbols and a data integrity marker, and use at least one extra symbol to mark the incoming data as error-free data or erroneous data. The device 100 further includes a memory 104 configured to store the incoming data.

The processor 102 may be further configured to create ECC to protect the data symbols, the ECC including a plurality of check symbols, a plurality of unused symbols and the at least one extra symbol. The processor may be further configured to determine that a partial write of a data block marked as erroneous data has been requested, convert the partial data block write to a full data block write, mark all ECC words in the data block as being erroneous, and write the data block with the marked ECC words into the memory 104.

The processor 102 may be further configured to read ECC including a plurality of check symbols, decode the ECC to recover at least one extra symbol, and determine whether the at least one extra symbol marks data in the ECC as error-free or erroneous.

Although features and elements of the embodiments are described above in particular combinations, each feature or element can be used alone without the other features and elements or in various combinations with or without other features and elements. The methods provided herein may be implemented in a computer program, software, or firmware incorporated in a computer-readable storage medium for execution by a general purpose computer or a processor.

Suitable processors include, by way of example, a general purpose processor, a special purpose processor, a conventional processor, a digital signal processor (DSP), a plurality of processors, one or more processors in association with a DSP core, a controller, a microcontroller, Application Specific Integrated Circuits (ASICs), Field Programmable Gate Arrays (FPGAs) circuits, any other type of integrated circuit (IC), and/or a state machine.

Embodiments of the present invention may be represented as instructions and data stored in a computer-readable storage medium. For example, aspects of the present invention may be implemented using Verilog, which is a hardware description language (HDL). When processed, Verilog data instructions may generate other intermediary data, (e.g., netlists, GDS data, or the like), that may be used to perform a manufacturing process implemented in a semiconductor fabrication facility. The manufacturing process may be adapted to manufacture and test semiconductor devices (e.g., processors) that embody various aspects of the present invention.

What is claimed is:

1. A method of encoding received data, the method comprising:
   receiving an incoming data block including a plurality of data symbols and a data integrity marker;
   marking the incoming data block using at least one extra symbol to indicate whether the incoming data block contains erroneous data based on the data integrity marker; and
   creating an error correction code (ECC) to protect the data symbols in the data block, wherein the ECC includes a plurality of check symbols, a plurality of unused symbols, and the at least one extra symbol.

2. The method of claim 1 further comprising:
   if a partial write of a data block that is marked as containing erroneous data is requested:
   converting the partial data block write to a full data block write;
   marking all error correction code (ECC) words in the data block as being erroneous; and
   writing the data block with the marked ECC words into memory.

3. The method of claim 2 wherein the partial data block write is converted by preserving remaining data in the data block.

4. The method of claim 2 wherein the partial data block write is converted by replacing remaining data with known data.

5. The method of claim 1 further comprising:
   if a partial write of a data block that is marked as containing erroneous data is not requested:
   marking all error correction code (ECC) words in the data block as being erroneous; and
   writing the data block with the marked ECC words into memory.

6. The method of claim 1 further comprising:
   reading an error correction code (ECC) including a plurality of check symbols;
   decoding the ECC to recover at least one extra symbol; and
   making a determination as to whether the at least one extra symbol marks data in the ECC as erroneous.

7. The method of claim 6 further comprising:
   forwarding the data in the ECC to a requestor with an indication that the data is error-free or erroneous based on the determination.

8. The method of claim 1 further comprising:
   reading an error correction code (ECC) word in a data block including a plurality of ECC words; and
   forwarding the read ECC word to a requestor on a condition that the ECC is determined not to have an error.

9. The method of claim 1 further comprising:
   reading a first error correction code (ECC) word in a data block including a plurality of ECC words; and
   forwarding all remaining ECC words in the data block to a requestor with an indication that the data block contains erroneous data, on a condition that the first ECC word has an error and any ECC word in the data block is marked as containing erroneous data.

10. A device comprising:
    a processor configured to receive an incoming data block including a plurality of data symbols and a data integrity marker, marking the incoming data block using at least one extra symbol to indicate whether the incoming data block contains erroneous data based on the data integrity marker, and creating an error correction code (ECC) to protect the data symbols in the data block, wherein the ECC includes a plurality of check symbols, a plurality of unused symbols, and the at least one extra symbol; and
    a memory configured to store the incoming data.

11. The device of claim 10 wherein, if a partial write of a data block that is marked as containing erroneous data is requested, the processor is further configured to convert the partial data block write to a full data block write, mark all error correction code (ECC) words in the data block as being erroneous, and write the data block with the marked ECC words into the memory.

12. The device of claim 10 wherein, if a partial write of a data block that is marked as containing erroneous data is not requested, the processor is further configured to mark all error correction code (ECC) words in the data block as being erroneous, and write the data block with the marked ECC words into the memory.

13. The device of claim 10 wherein the processor is further configured to read error correction code (ECC) including a plurality of check symbols, decode the ECC to recover at least one extra symbol, and determine whether the at least one extra symbol marks data in the ECC as erroneous.

14. A non-transitory computer-readable storage medium configured to store a set of instructions used for testing a semiconductor device, wherein the semiconductor device comprises:
    a processor configured to receive an incoming data block including a plurality of data symbols and a data integrity marker, marking the incoming data block using at least one extra symbol to indicate whether the incoming data block contains erroneous data based on the data integrity marker, and creating an error correction code (ECC) to protect the data symbols in the data block, wherein the ECC includes a plurality of check symbols, a plurality of unused symbols, and the at least one extra symbol; and
    a memory configured to store the incoming data.

15. The non-transitory computer-readable storage medium of claim 14 wherein the instructions are one of or a combination of Verilog data instructions and hardware description language (HDL) instructions.

16. The non-transitory computer-readable storage medium of claim 14 wherein the processor is further configured to create error correction code (ECC) to protect the data symbols, the ECC including a plurality of check symbols, a plurality of unused symbols and the at least one extra symbol.

17. The non-transitory computer-readable storage medium of claim 14 wherein, if a partial write of a data block that is marked as containing erroneous data is requested, the processor is further configured to convert the partial data block write to a full data block write, mark all error correction code (ECC) words in the data block as being erroneous, and write the data block with the marked ECC words into the memory.

18. The non-transitory computer-readable storage medium of claim 14 wherein, if a partial write of a data block that is marked as containing erroneous data is not requested, the processor is further configured to mark all error correction code (ECC) words in the data block as being erroneous, and write the data block with the marked ECC words into the memory.

* * * * *